United States Patent [19]
Kronenberg

[11] 3,940,735
[45] Feb. 24, 1976

[54] DEVICE TO INDICATE NEED TO SERVICE OR INSPECT A MOTOR VEHICLE

[75] Inventor: Hartmut Kronenberg, Schwalbach, Germany

[73] Assignee: VDO Adolf Schindling AG, Frankfurt am Main, Germany

[22] Filed: Oct. 11, 1974

[21] Appl. No.: 514,104

[30] Foreign Application Priority Data
Oct. 26, 1973  Germany............................ 2353756

[52] U.S. Cl............. 340/52 D; 73/490; 235/92 DN; 340/309.1
[51] Int. Cl.².......................................... G01C 22/02
[58] Field of Search ........ 340/51, 52 R, 52 D, 52 F, 340/309.1, 56, 150; 73/489, 490, 495, 509, 510; 116/28, 29, 73; 235/92 DN, 97, 92 R

[56] References Cited
UNITED STATES PATENTS

| | | | |
|---|---|---|---|
| 2,295,533 | 9/1942 | Leathers............................. | 340/150 |
| 2,344,254 | 3/1944 | Leathers et al..................... | 340/150 |
| 3,636,517 | 1/1972 | Stoten................................. | 340/150 |
| 3,665,397 | 5/1972 | Dinapoli et al.................... | 340/51 X |
| 3,754,122 | 8/1973 | Dinapoli et al. ................ | 235/92 DN |

*Primary Examiner*—Alvin H. Waring
*Attorney, Agent, or Firm*—Otto John Munz

[57] ABSTRACT

Device for indicating when a vehicle has travelled a predetermined distance, calling for inspection or servicing of some part of the vehicle. An electrochemical indicator integrates a signal indicative of the vehicle speed to provide an output indication.

6 Claims, 3 Drawing Figures

DEVICE TO INDICATE NEED TO SERVICE OR INSPECT A MOTOR VEHICLE

BACKGROUND OF THE INVENTION

1. Field of the Invention

The invention relates to a device for indicating the need for service or inspection of a motor vehicle, wherein the service or inspection is carried out whenever the vehicle has travelled certain mileage. An indicator is provided which, at the end of the prespecified mileage, generates a visible or audible signal.

2. Description of the Prior Art

For the decontamination of exhaust gases of motor vehicles, exhaust gas catalysts have lately been developed which are installed in the exhaust system. Such catalysts are generally no longer effective after having been in use for a certain period of time and must then be replaced by fresh ones. Therefore, the need for a device exists which after a certain mileage, generally 12,500 km (i.e., 7767.5 miles), indicates by means of a visible or audible signal the replacement to be carried out, and in which the signal can only be extinguished after replacement of the catalysts, so as to permit a control of the replacement by the traffic police or other governmental authorities.

To indicate the need for a service or inspection to be carried out after a certain mileage has been covered, a number of devices are already known. In most of these devices, a switch contact is provided in connection with the odometer of the motor vehicle, and the switch contact is actuated after a specific mileage to generate a visible or audible signal. Such devices have the disadvantage that, during continuing operation, the signal is extinguished after a number of miles, regardless of whether or not the service or inspection work has been carrried out. Another known device contains a cam driven by an odometer, which cam acts upon a unilaterally clamped-in leaf spring whose free end engages a groove in a spring-loaded indication drum. After a specific mileage the leaf spring is disengaged from the indicating roller by the cam, which therefore pivots into its indicating position. A considerable disadvantage of this device is that, when the service or inspection work must be carried out somewhat earlier than required, the signal is nevertheless switched on after the prespecified mileage has been reached. Moreover, a switching-off of the notice is only possible after a certain mileage has been covered. Besides, such a device presents the disadvantage of being bulky and must be placed in a casing of its own, outside the tachometer. Electrochemical elements are used for measurement mileage travelled by rental automobiles to calculate rental fees in U.S. Pat. No. 3,665,397 and 3,754,122.

SUMMARY OF THE INVENTION

These disadvantages are to be eliminated by the invention. The invention therefore creates a device wherein the visible or audible signal, once it has appeared, can be reextinguished by zeroing of the device by an authorized person, and an extinction of the indicator by re-zeroing is possible even before the end of the prespecified mileage without producing a premature signal thereafter. Furthermore, the structural volume of the device should be such that it can be installed within the tachometer of a motor vehicle.

The invention provides an indicator in the form of an electrochemical ampere-hour cell, controlled by a speed-signal transmitter which produces a signal proportional to the prevailing motor vehicle speed, operating by integration to measure the predetermined mileage.

The current supplied by the speedometer generally consists of pulses equal polarity, whose number per time unit is proportional to the motor vehicle speed. This current causes an electrochemical reaction of the electrolyte which is stronger when the number of current pulses per time unit and therefore the speed of the motor vehicle is greater. Since, according to Faraday's law, the quantity of the materials converted by reaction in an electrolytic cell is proportional to the quantity of electric current which has passed the cell, the quantity of materials converted by reaction is proportional to the mileage covered by the motor vehicle.

By the use of commercial electrochemical ampere-hour cells of small structure which indicate directly or indirectly the electrolytically reacted material quantity and thus the covered mileage, the structural volume of the device can be kept to a bare minimum. It is possible to place the ampere-hour cell and the means controlled by the cell that might be additionally required for indicating the quantity of material converted by reaction into a customary mechanical or electric tachometer. A further reduction in the structural volume and in the price of the device can be accomplished in motor vehicles with an electric tachometer, such as are produced in growing numbers, by connecting the ampere-hour cell to the output circuit of the tachometer. This is so because a separate speed signal transmitter for the ampere-hour cell can in this case be omitted. Instead of an electrochemical ampere-hour cell, other ampere-hour indicator, particularly electromechanical ones, could be used, but the problems which form the base of the present invention cannot be solved, or can only be solved with substantial difficulty and expense, when such indicators are employed.

In a preferred embodiment, an ampere-hour cell constructed as a small incandescent lamp and filled with a liquid electrolyte is provided wherein, after a prespecified mileage has been covered, a color change of the electrolyte occurs. Such an ampere-hour cell has the advantage that it has particularly small outer dimensions, can be readily lodged in a tachometer or another motor vehicle instrument, and can be read with extreme ease. Since such an ampere-hour cell cannot be regenerated after the occurrence of the color change, in order to re-zero the device, the cell must be replaced when the service or inspection work for which a need is indicated is being carried out.

When a device that produces an audible signal, or a light source is arranged, e.g., on the outside of the motor vehicle body at a place well visible from a distance so that it will automatically be switched on when the end of the prespecified mileage has been reached, it is advisable to use an embodiment provided with an electrolytic miniature cell. In this case, after a prespecified mileage has been reached, an unsteady resistance varation occurs and a threshold-value switch connected in series to the cell is operated, by means of which the device or the light source can be switched on. Although the expense for the electronics in such an embodiment is greater than in the one described above, this device can also be installed without difficulties in the tachometer or other motor-vehicle instrument.

Especially for control of such an ampere-hour indicator by means of a number of pulses per unit of time proportional to the motor-vehicle speed, it is advisable to connect in series with the electrolytic miniature cell an integrating RC element by which the digital input signal is converted to an analog signal. By this device, expensive latching circuits in the output stage of the threshold value switch can be avoided. This device can also be used in other ampere-hour indicator if it should be required on account of the meter structure or for other reasons.

In another embodiment, an electrolytic miniature cell with two mercury electrodes mounted in a small tube and an electrolyte filling the space between them is provided. The electrolyte consists of an aqueous solution of an iodide salt and mercury iodide. The visible distance from one end of the small tube of the electrolyte changes proportionally to the mileage passed. Such a miniature cell, in comparison to the cells above described, has the advantage that a continuous signal is present, from which the driver of the motor vehicle can learn what mileage the motor vehicle can still cover before the service or inspection must be carried out, and which also shows the amount of mileage by which the service or inspection time was exceeded. A further advantage is that the cell can be regenerated, that is to say, when the device is being re-zeroed after the service or inspection work is carried out, the cell can be reutilized and need not be replaced.

BRIEF DESCRIPTION OF THE DRAWINGS

The invention will be explained in greater detail with the aid of the drawing which contains three embodiments.

DESCRIPTION OF THE PREFERRED EMBODIMENTS

Figure 1:
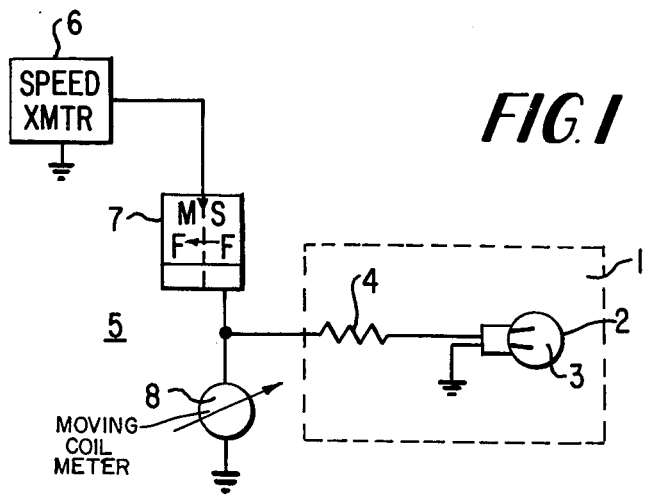
Fig. 1 is a diagram of a device with an ampere-hour meter with a color conversion indication.

The apparatus 1 according to FIG. 1 contains an ampere-hour indicator or sensor 2, of a commercially available sort, shaped as an incandescent lamp and filled with an electrolyte 3 which, in the normal state, is of a yellow color. After a prespecified mileage has been covered, this color is changed to green. Ampere-hour indicator 2 is connected, by way of a high-resistance resistor 4 to the output circuit of a tachometer 5. By means of the resistance of resistor 4, the mileage to be covered before the ampere-hour indicator 2 changes its color can be prespecified. The longer mileage is the prespecified mileage tube covered, the greater is the resistance.

tachometer 5 comprises a speed signal transmitter 6, which may be of an inductive, capacitive, galvanic, or other type and whose output is connected to the sensing input of a monostable flip flop 7, which receives the input signal pulses from transmitter 6 and generates output pulses of constant amplitude and constant length. The positive output of monostable flip-flop 7 is connected to a moving coil indicator, such as a D'Arsonval meter, which integrates the pulses on the basis of its inertia and indicates the prevailing traveling speed of the motor vehicle.

Figure 2:
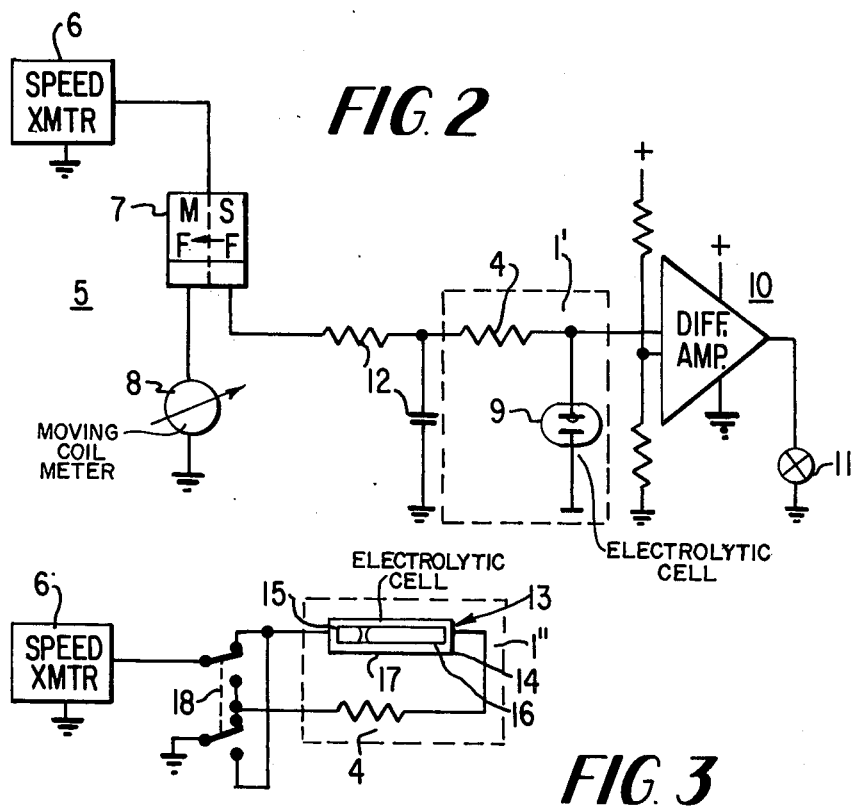
FIG. 2 is a diagram of a device with an ampere-hour meter and with a threshold value switch connected in series to the ampere-hour meter.

In the embodiment according to FIG. 2, the apparatus 1' contains a commercially available electrolytic miniature or sensor 9 whose internal resistance increases suddenly after the prespecified mileage has been covered, whereby the voltage drop across cell 9 suddenly increases. For the adjustment of the required mileage, a high-resistance-resistor 4 is used, as in the apparatus 1 of FIG. 1 described above. With respect to its resistance value, the statements made in connection with the apparatus described above are applicable. The variation in voltage drop at cell 9 controls a threshold value switch 10 whose output is connected to a signal lamp 11.

Device 1' is also controlled by electronic tachometer 5 mounted in the motor vehicle and, in contrast to the embodiment of FIG. 1, the rotary coil measuring mechanism 8 is in this case connected to the second output of the monostable flip-flop 7. Any reactive effects from the moving coil indicator 8 upon the control current are thereby safely eliminated. In order to avoid a pulsating voltage drop at cell 9, which results in a pulsating operation of threshold value switch 10 unless the latter is provided with a latching circuit, an integrating RC element 12 is connected in series to cell 9, which element transforms the digital output signal of monostable flip flop 7 into an analog signal.

Figure 3:
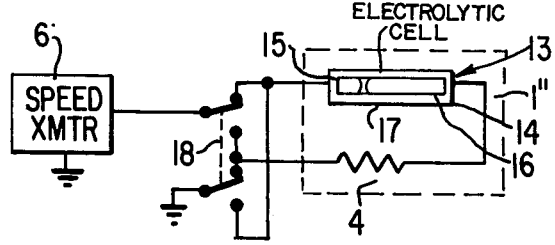
FIG. 3 is a diagram of a device with an ampere-hour meter which supplies a continuous signal.

The embodiment of FIG. 3 contains an apparatus 1" with a commercially available electrolytic miniature cell or sensor 13. Miniature cell 13 consists of a small tube 14 with a sight glass and two mercury electrodes 15 and 16 mounted in the small tube 14 and separated by the electrolyte 17. Electrolyte 17 is an aqueous solution of an iodide salt and mercury iodide. When current passes through cell 13, mercury is electrolytically deposited at one of the mercury electrodes 15, while the other mercury electrode 16 is decomposed. Consequently, electrolyte 17 migrates slowly from one end of small tube 14 to the other, and migrates back at the reversal of the direction of the current. For reversing the direction of the current, a bipolar switch 18 is provided by means of which apparatus 11" is attached to a speed signal transmitter 6. The adjustment of cell 13 to the required mileage is carried out by a high-resistance resistor 4, whose value is adjusted as discussed above.

The monostable flip-flop is also known as a monostable multivibrator. Electro-chemical ampere-hour indicators of the type disclosed are commercially available in the U.S. for instance from the firms Bissett-Berman, Los Angeles and Curtis Instruments Corporation, Montkisco, N.Y.

What is claimed is:

1. A device for indicating the need for service or inspection of a motor vehicle because of the passage of a prespecified mileage since the device was zeroed, comprising:
   A. a signal transmitter (6) for producing an electrical signal proportional to the actual speed of the motor vehicle,
   B. an electrochemical ampere-hour sensor means (2, 9 or 13) connected to receive said signal and to integrate the amplitude of the signal over a time period, whereby the integrated signal provides a measure of the miles travelled by the vehicle, and
   C. means connected with the sensor for supplying a signal to an operator of the motor vehicle when the integrated signal reaches a prespecified value.

2. A device according to claim 1, wherein the ampere-hour sensor means (2) is constructed in the form of a small incandescent lamp and is filled with a liquid electrolyte (3), the liquid electrolyte being of the sort that, after said prespecified value is reached, a color change occurs in the electrolyte.

3. A device according to claim 1, wherein the ampere-hour sensor means (9) is an electrolytic miniature cell of a type wherein, after said prespecified value is reached, an unsteady resistance variation occurs therein, and further comprising a threshold value switch (10) connected in series with the cell.

4. A device according to claim 3, wherein the signal transmitter (6) supplies a number of pulses per time unit that is proportional to the speed of the motor vehicle, said pulses being supplied to an integrating RC element (12) connected in series with the cell (9).

5. A device according to claim 1, wherein the ampere-hour sensor means (13) comprises two mercury electrodes (15 and 16) mounted in a small tube (14), and an electrolyte (17), filling the space between the said mercury electrodes (17), the electrolyte consisting of an aqueous solution of an iodide salt and mercury iodide, the visible distance of the electrolyte from one end of the small tube varying in proportion to the value of the integrated signal.

6. A device according to claim 1 for a motor vehicle with an electric tachometer, wherein the ampere-hour sensor means (2, 9 or 13) is connected to an output circuit of the tachometer (5).

\* \* \* \* \*